(12) United States Patent
Grancharov et al.

(10) Patent No.: US 10,468,044 B2
(45) Date of Patent: *Nov. 5, 2019

(54) VECTOR QUANTIZER

(71) Applicant: Telefonaktiebolaget LM Ericsson (publ), Stockholm (SE)

(72) Inventors: Volodya Grancharov, Solna (SE); Tomas Jansson Toftgård, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/805,768

(22) Filed: Nov. 7, 2017

(65) Prior Publication Data

US 2018/0061429 A1 Mar. 1, 2018

Related U.S. Application Data

(63) Continuation of application No. 15/187,943, filed on Jun. 21, 2016, now Pat. No. 9,842,601, which is a
(Continued)

(51) Int. Cl.
*G10L 19/00* (2013.01)
*G10L 19/038* (2013.01)
(Continued)

(52) U.S. Cl.
CPC .......... *G10L 19/038* (2013.01); *G10L 19/18* (2013.01); *H03M 7/3082* (2013.01); *H04N 19/94* (2014.11); *G10L 2019/0013* (2013.01)

(58) Field of Classification Search
CPC ....... G10L 19/22; G10L 19/135; G10L 19/04; G10L 19/07; G10L 19/06; G10L 19/038;
(Continued)

(56) References Cited

U.S. PATENT DOCUMENTS 5,826,224 A * 10/1998 Gerson ................... G10L 19/06
704/222
5,873,060 A * 2/1999 Ozawa ................ G10L 19/0208
704/230

(Continued)

OTHER PUBLICATIONS

Chen et al., ("Fast codebook search algorithm for unconstrained vector quantization", IEE proceedings: Vision, Image and signal processing, Institution of Electrical engineers, GB, vol. 145, No. 2, Apr. 23, 1998, pp. 97-102), 1998.*

(Continued)

*Primary Examiner* — Vijay B Chawan
(74) *Attorney, Agent, or Firm* — Sage Patent Group

(57) ABSTRACT

Vector Quantizer and method therein for vector quantization, e.g. in a transform audio codec. The method comprises comparing an input target vector with four centroids $C_0$, $C_1$, $C_{0,flip}$ and $C_{1,flip}$, wherein centroid $C_{0,flip}$ is a flipped version of centroid $C_0$ and centroid $C_{1,flip}$ is a flipped version of centroid $C_1$, each centroid representing a respective class of codevectors. A starting point for a search related to the input target vector in the codebook is determined, based on the comparison. A search is performed in the codebook, starting at the determined starting point, and a codevector is identified to represent the input target vector. A number of input target vectors per block or time segment is variable. A search space is dynamically adjusted to the number of input target vectors. The codevectors are sorted according to a distortion measure reflecting the distance between each codevector and the centroids $C_0$ and $C_1$.

16 Claims, 9 Drawing Sheets

Related U.S. Application Data continuation of application No. 14/387,716, filed as application No. PCT/SE2012/051381 on Dec. 12, 2012, now Pat. No. 9,401,155.

(60) Provisional application No. 61/617,151, filed on Mar. 29, 2012.

(51) Int. Cl.
*G10L 19/18* (2013.01)
*H04N 19/94* (2014.01)
*H03M 7/30* (2006.01)

(58) Field of Classification Search
CPC ......... G10L 19/10; G10L 19/18; G10L 17/10; G10L 19/00; G10L 19/0208; G10L 19/083; G10L 19/097; G10L 19/107; G10L 25/06; G10L 25/24
USPC ....... 704/222, 230, 219, 220, 223, 205, 217, 704/221
See application file for complete search history.

(56) References Cited

U.S. PATENT DOCUMENTS

| | | | | |
|---|---|---|---|---|
| 6,148,283 A * | 11/2000 | Das | ............ | G10L 19/07 704/222 |
| 6,980,951 B2 * | 12/2005 | Chen | ............ | G10L 19/04 704/220 |
| 7,209,878 B2 * | 4/2007 | Chen | ............ | G10L 19/04 704/219 |
| 7,643,996 B1 * | 1/2010 | Gottesman | ............ | G10L 19/097 704/205 |
| 7,809,557 B2 * | 10/2010 | Morii | ............ | G10L 19/135 704/219 |
| 7,925,501 B2 * | 4/2011 | Yasunaga | ............ | G10L 19/10 704/222 |
| 8,027,380 B2 * | 9/2011 | Vasilache | ............ | G10L 19/00 375/240 |
| 2002/0069052 A1 * | 6/2002 | Chen | ............ | G10L 19/04 704/230 |
| 2002/0072904 A1 * | 6/2002 | Chen | ............ | G10L 19/04 704/230 |
| 2003/0078773 A1 * | 4/2003 | Thyssen | ............ | G10L 19/07 704/230 |
| 2004/0015346 A1 * | 1/2004 | Yasunaga | ............ | G10L 19/07 704/219 |
| 2004/0039567 A1 * | 2/2004 | Jasiuk | ............ | G10L 19/12 704/222 |
| 2005/0285764 A1 * | 12/2005 | Bessette | ............ | G10L 19/10 341/143 |
| 2007/0129946 A1 | 6/2007 | Ma et al. | | |
| 2008/0275698 A1 * | 11/2008 | Yasunaga | ............ | G10L 19/12 704/222 |
| 2010/0174539 A1 * | 7/2010 | Nandhimandalam | ............ | G10L 19/038 704/222 |
| 2011/0316732 A1 * | 12/2011 | Satoh | ............ | G10L 19/038 341/200 |
| 2012/0016673 A1 * | 1/2012 | Das | ............ | G10L 17/10 704/246 |
| 2012/0185242 A1 * | 7/2012 | Morii | ............ | G10L 19/12 704/203 |

OTHER PUBLICATIONS

Mohammadi et al.,:"Application of sorted codebook vector quantization to spectral coding of speech", Globaltelecommunications Conference, Conference Record. Communi Cation Theory Miniconference, Globecom '95.,IEEE Singapore Nov. 13-17, 1995, New York, NY, USA, IEEE, US, vol. 3, Nov. 13, 1995, pp. 1595-1598, 1995.*
International Search Report, PCT Application No. PCT/SE2012/051381, dated Jun. 13, 2013.
Written Opinion of the International Searching Authority, PCT Application No. PCT/SE2012/051381, dated Jun. 13, 2013.
International Preliminary Report on Patentability, PCT Application No. PCT/SE2012/051381, dated Aug. 22, 2014.
Chen et al., "Fast codebook search algorithm for unconstrained vector quantisation", *IEE Proceedings: Vision, Image and Signal Processing*, vol. 145, No. 2, Apr. 1998, pp. 97-102.
Feng et al., "Dynamic Codebook Adaptive Vector Quantization for Image Coding", *IEEE Transactions on Consumer Electronics*, vol. 45, No. 2, May 1999, pp. 327-332.
Kekre et al., "Fast Codebook Search Algorithm for Vector Quantization using Sorting Technique", *International Conference on Advances in Computing, Communication and Control (ICAC3 '09)*, Jan. 2009, pp. 317-325.
Lu et al., "A Survey of VQ Codebook Generation", *Journal of Information Hiding and Multimedia Signal Processing*, vol. 1, No. 3, Jul. 2010, pp. 190-203.
Mohammadi et al., "Application of Sorted Codebook Vector Quantization to Spectral Coding of Speech", *GLOBECOM '95, IEEE Global Telecommunications Conference*, vol. 3, Nov. 13, 1995, pp. 1595-1598.
Nippon Telegraph & Telephone, Machine Translation of JPS63217878(A), dated Sep. 9, 1988 (copy of patent document not found), 11 pages.
Intellectual Property India, Application No. 7726/DELNP/2014, Examination Report dated Sep. 4, 2019, 8 pages.

* cited by examiner

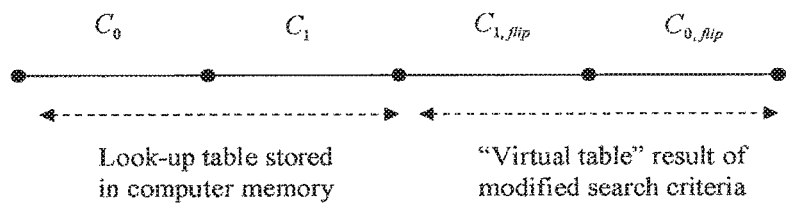
Figure 2
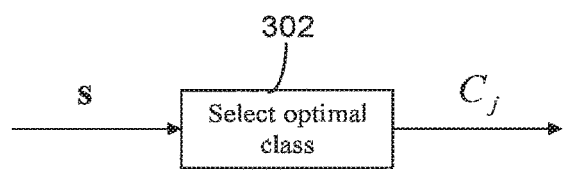
Figure 3
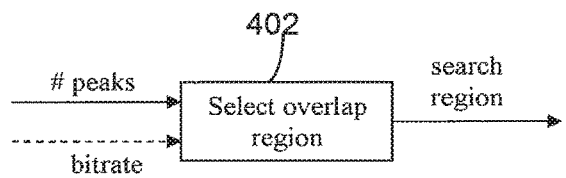
Figure 4
| # peaks | 17 | 16 | 15 | 14 | 13 | 12 | 11 | 10 | 9 | 8 | ... | 1 |
|---|---|---|---|---|---|---|---|---|---|---|---|---|
| # coefficients in the search | 128 | 136 | 145 | 155 | 167 | 181 | 197 | 217 | 241 | 256 | ... | 256 |
Figure 5

VECTOR QUANTIZER

CROSS REFERENCE TO RELATED APPLICATIONS

This present application claims priority under 35 U.S.C. § 120 as a continuation of U.S. patent application Ser. No. 15/187,943, filed Jun. 21, 2016, which is a continuation of U.S. patent application Ser. No. 14/387,716, filed Sep. 24, 2014 (now U.S. Pat. No. 9,401,155), which is a 35 U.S.C. § 371 national stage application of PCT International Application No. PCT/SE2012/051381, filed Dec. 12, 2012, which itself claims priority to U.S. provisional Patent Application No. 61/617,151, filed Mar. 29, 2012, the disclosures and contents of which are incorporated by reference herein in their entireties. The above-referenced PCT International Application was published in the English language as International Publication No. WO 2013/147667 A1 on 3 Oct. 2013.

TECHNICAL FIELD

The suggested technology relates generally to vector quantization (VQ), and especially to the accuracy and computational complexity of the same.

BACKGROUND

There are two major classes of quantization algorithms, namely: scalar quantizers (SQs), which process an input vector element by element, and vector quantizers (VQs), which quantize an input vector as one unit (all vector dimensions are quantized jointly). At a given bitrate, VQs are superior to the SQs, but at a cost of increased computational complexity and memory storage.

Let the target vector to quantize be M dimensional: $s=[s(1)\ s(2)\ \ldots\ s(M)]$. The VQ algorithm performs a search in a codebook (CB) of size K, $\{c_k\}_{k=1}^{K}$ of pre-stored M dimensional codevectors $c_k=[c_k(1)\ c_k(2)\ \ldots\ c_k(M)]$. Such a search returns the index of the codebook vector that provides the best match $k^{opt}$ based on a distortion measure $d(s,c_k)$. Equations (1-2) below describe this operation, assuming that the search criterion is based on a squared error:

$$k^{opt} = \operatorname*{argmin}_{k} d(s, c_k) \quad (1)$$

$$d(s, c_k) = \sum_{m=1}^{M} (s(m) - c_k(m))^2 \quad (2)$$

The optimal index $k^{opt}$ is transmitted to the decoder, and the corresponding codevector is extracted from the CB (identical CBs are available both at the encoder and the decoder) and is used to reconstruct the target vector. The CB is typically trained offline and captures the statistical properties of the data. In many cases the simple squared error (cf. equation (2)) is modified with weights, such that:

$$d(s, c_k) = \sum_{m=1}^{M} w(m) \cdot (s(m) - c_k(m))^2 \quad (3)$$

where the weights $w(m)$ are application dependent. For simplicity of the presentation herein, only squared error, defined in equation (2) will be used in the further description. However, it should be noted that the principles discussed herein are valid also when more sophisticated criteria, such as the one in equation (3), are used.

As may be concluded from the description above, the accuracy or quality of the reconstructed target signal is dependent on the size K of the codebook; where a large CB leads to higher accuracy, and thus better quality, than a smaller CB. At the same time, from equation (1) it may be concluded that the main computational complexity also is related to the size of the CB, assuming that the vector dimensionality is fixed by the application.

Typically, audio transmission systems are built under the constraints of limited computational complexity. That is, the worst case complexity should not exceed a certain predefined level $L_{MAX}$. For example, the computational complexity of an audio codec is typically measured by means of Weighted Millions of Operations per Second (WMOPS), but as we consider a VQ module, the complexity is directly related to the size of the search space (size of the CB). A VQ is typically the most complex module in a codec, and further, the CB search (number of comparisons with CB vectors) is what makes the VQ so complex.

If a VQ system is to quantize one target vector s at a time, the search space K has to be optimized such that complexity does not exceed $L_{MAX}$. Some off-line optimization techniques, such as split and multi-stage VQ can provide certain reduction of complexity (and storage), given the properties of vector s and the quality requirements for the reconstructed vector.

If the VQ system is to quantize multiple target (input) vectors $\{s_n\}_{n=1}^{N}$ at a time, with a varying number of vectors N, the off-line optimization techniques mentioned above are not capable of maintaining complexity and quality constraints. In such cases, the offline optimization have to find a balance between contradicting requirements of A) limiting complexity (=limiting the search) when a large number of input vectors are to be quantized simultaneously, and B) maintaining high accuracy (=search in large codebook) when a low number of vectors are to be quantized, which is not a simple task.

SUMMARY

The technology described herein is applicable e.g. for audio and video compression/transmission systems that perform lossy compression on the input stream, and could be described in a number of different aspects. The herein described technology involves a codebook, which is divided into classes and sorted, and the classification of an input target vector s to be quantized into one of said classes. The herein described technology enables that the class of codevectors, in the codebook, which comprises the most probable set of candidate codevectors in regard of the input vector s is searched first of the classes in the codebook. Thus, the best match codevector for the input vector s may be found early in a search, and the computational complexity may be reduced.

According to a first aspect, a method in a Vector Quantizer is provided. The method comprises comparing an input target vector s with a plurality of centroids, i.e. reference vectors, where each centroid represents a respective class of codevectors in a codebook. The method further comprises determining a starting point, in a codebook, for a search related to the input target vector in the codebook, where the starting point is determined based on the result of the comparison. The codevectors in the codebook are sorted according to a distortion measure reflecting the distance between each codevector and the centroids. The method enables that the class of codevectors, in the codebook, which comprises the most probable set of candidate codevectors in regard of the input vector s is searched first of the classes in the codebook.

According to a second aspect, a Vector Quantizer is provided, comprising functional units adapted to execute the method according to the first aspect. The Vector Quantizer comprises a comparing unit adapted to compare an input target vector s with a plurality of centroids, each centroid representing a respective class of codevectors in a codebook. The Vector Quantizer further comprises a determining unit adapted to determine a starting point for a search in the codebook, based on the result of the comparison. The codevectors in the codebook are sorted according to a distortion measure reflecting the distance between each codevector and the centroids. The Vector Quantizer enables that the class of codevectors comprising the most probable candidate codevectors in regard of the input vector s are searched first of the classes in the codebook.

According to a third aspect, a codec is provided, which comprises a Vector Quantizer according to the second aspect.

According to a fourth aspect, a mobile terminal is provided, which comprises a Vector Quantizer according to the second aspect above.

According to a fifth aspect, a codebook for vector quantization is provided, which codebook is arranged such that the codevectors of the codebook are divided into a plurality of classes, each represented by a centroid, and where the codevectors further are sorted according to a distortion measure reflecting their distance to the centroids of the plurality of classes. The codevectors may be sorted according to e.g. descending or increasing distortion value.

According to a sixth aspect, a use of a codebook for vector quantization is provided, which codebook is arranged such that the codevectors of the codebook are divided into a plurality of classes, each represented by a centroid, and where the codevectors further are sorted according to a distortion measure reflecting their distance to the centroids of the plurality of classes. The codevectors may be sorted according to e.g. descending or increasing distortion value.

According to a seventh aspect, a computer program is provided, comprising computer readable code, which when run in a processing unit, causes a Vector Quantizer to perform a method according to the first aspect.

According to an eight aspect, a computer program product is provided, comprising a computer readable medium and a computer program according to the sixth aspect, stored on the computer readable medium.

The size of a search region in the codebook, in which a search is performed, may be adapted based on a number of input target vectors and a maximum complexity constraint. The number of input target vectors per coding unit may be variable. Further, the maximum complexity constraint may be set dynamically. Further, a search could be performed in the codebook in the determined search space, starting at the determined starting point, where the search delivers a best match to the input target vector s. By "best match" is here meant the closest match, shortest distance, in regard of a distance measure between the input target vector and a candidate vector in the codebook, i.e. a best match is a code vector which has the shortest distance to the input target vector, according to the distance measure.

A fifth aspect may be a codec comprising a vector quantizer according to the second aspect.

A sixth aspect may be a mobile terminal comprising a vector quantizer according to the second aspect.

BRIEF DESCRIPTION OF THE DRAWINGS

The suggested technology will now be described in more detail by means of exemplifying embodiments and with reference to the accompanying drawings, in which:

FIG. 2 shows an exemplifying CB structure exploiting symmetry. Only codevectors of $C_0$ and $C_1$ are stored in a ROM memory.

FIG. 3 illustrates an exemplifying functional unit for determining an optimal class for an input vector s by comparing the input vector s to each of a number of centroids $\{C_0\ C_1\ C_{1,flip}\ C_{0,flip}\}$, each associated with a class in a codebook.

FIG. 4 illustrates a functional unit for determining a size of a search region in a codebook based on a number of spectral peaks detected in a current frame, and possibly on the codec's bitrate.

FIG. 5 is a table illustrating that a search region increases as the number of peaks per-frame decrease. In the example; with 17 peaks (=17 input vectors) the search is performed only in 7-bit CB (defined to be the minimum search space in this example), but with 8 peaks or less, the search is performed in 8-bit CB (maximum search space), since this can be "afforded" under the maximum complexity constraint.

DETAILED DESCRIPTION

Briefly described, the solution described herein relates to dynamically adapting the search space of a VQ, such that, for any number of target (input) vectors (per block or time interval), a high accuracy, and thus quality, quantization is achieved within a given complexity constraint. That is, the requirements of computational complexity (cf. $L_{max}$) are not to be violated. This is achieved by that the search is performed in a special classified and ordered CB. The starting point in the search space for each target vector is based on a classification procedure, and the size of the search space is increased or reduced, based on the number of target vectors. The VQ algorithm described herein may be regarded as a "tool" for data compression, independent of what the data is, i.e. the data could be e.g. video and/or audio. In this description, the VQ is described in the context of an audio codec, but the concept described herein is not limited to audio codecs. For example, it could also be implemented in video codecs.

The algorithm described herein is based on a specially designed CB. Some variants of such a codebook will be described in more detail below. First a basic case will be described, and further below a more advanced scheme will be discussed. The codevectors of the CB may be arranged according to the solution described herein in an offline mode.

In order to create a basic version of the specially designed advantageous CB, the codevectors of a CB are split into two classes, here denoted $C_0$ and $C_1$ (this notation will be used both for the names of the classes, as well as for the corresponding centroids, cf. FIG. 1). To partition data into two classes a so-called K-means algorithm (Generalized Lloyd's algorithm) may be used. It is a well known technique, which takes an entire data set as input, and the desired number of classes, and outputs the centroids of the desired number of classes. For example, the algorithm outputs 2 centroid vectors if the desired number of classes have been indicated to 2. Note that these centroids, when using a K-means algorithm, are vectors of the same dimension as the vectors from the data set, but they do not belong to the data set. That is, the centroid vectors are outside the CB and do not need to coincide with some existing codevectors. By "centroid" is herein generally meant a reference vector representing a class of vectors.

All codevectors in the CB are then sorted according to a distortion measure, e.g. as the one defined in equation (4)

$$d(c_k, C_0, C_1) = \sum_{m=1}^{M} (s_k(m) - C_0(m))^2 - \sum_{m=1}^{M} (s_k(m) - C_1(m))^2 \quad (4)$$

Figure 1A:
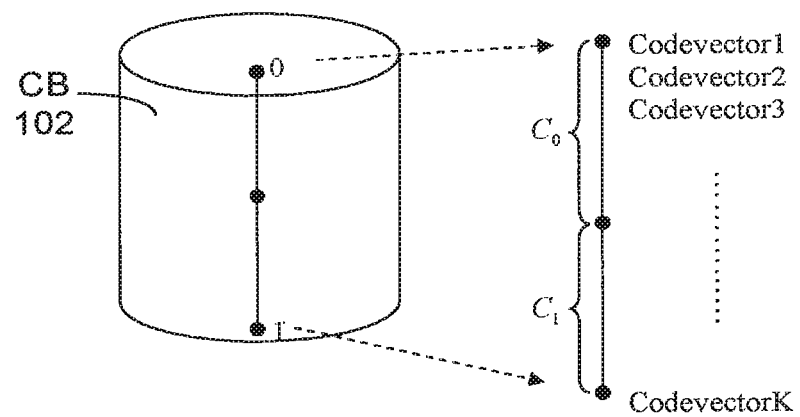
FIGS. 1a and 1b shows the structure of an ordered CB according to a solution described herein. The search starts from point 0 or point 1 towards the other end of the CB.
Figure 1B:
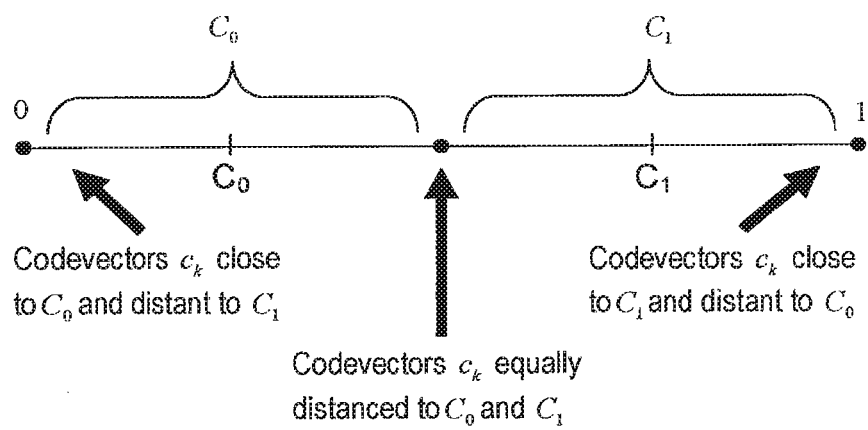

The distortion measure above results in, or assumes, large negative values for codevectors close to $C_0$, and large positive values for codevectors close to $C_1$. The codevectors which are equally distanced from the centroids ($C_0$ and $C_1$) of the two classes produce a distortion measure d which is close to zero. In the CB the codevectors are ordered e.g. by increasing distortion measure, as illustrated in FIGS. 1a and b.

Each input target vector is compared with the two centroids (the respective centroid of the two classes) and is, depending on the result, assigned to, i.e. concluded or determined to belong to, either class $C_0$ or class $C_1$. Based on that classification, the starting point of the search is either selected to be the most upper point (FIG. 1a) or most left (FIG. 1b) point 0 (when the target vector belongs to class $C_0$) or the lowest point (FIG. 1a) or most right (FIG. 1b) point 1 (when the target vector belongs to class $C_1$). Now, the size of the search space should be made dependent on the number of input target vectors N per block or time segment/interval. If we re-define the search space K not to be the size of the entire CB, but to be variable, the concept behind the adaptation described herein may be defined in equation (5)

$$N \times K \approx \text{const} \quad (5)$$

In other words #Quantizers×#Operations_per_Quantizer ≈const, where "Quantizer" may be regarded as the algorithm that maps an input vector to one of the codevectors.

Herein, as an example, the VQ is described in a context of a transform codec which encodes spectral peaks, or strictly, the regions around spectral peaks. In the context of such a codec, an input target vector may reflect a spectral peak (region) of a segment of the audio signal being processed. The number of spectral peaks in the signal spectrum of a time segment, e.g. 30 ms, of an audio signal depends on the spectral properties of the audio signal in that time segment. Since the spectral properties of an audio signal may vary over time and is different e.g. for different types of audio, the number of spectral peaks may vary between different time segments and between different audio signals. Thus, when using a transform encoder which encodes spectral peak regions, the number of input vectors, per block or time segment, to the VQ will vary. In the examples herein, the maximum number of input vectors, corresponding to a number of spectral peaks in a time segment of an audio signal, is 17. However, this number is only an example, and should not be interpreted as limiting the solution in general.

Effectively, the scheme described above keeps the number of operations required for the VQ in a narrow range (or almost constant); that is, when the number of VQs increases, i.e. number of input target vectors increases, the number of operations per-VQ decreases (the size of the search space decreases/only part of the CB is searched), such that the complexity requirements (i.e. constraints) are not violated. With a decrease of N, the search space K may be increased, at most up to the size of the entire CB, which leads to higher accuracy and thus quality of the reconstructed vector. The accuracy of a vector quantizer may be measured as a squared error between an original signal and corresponding reconstructed data.

In this way, the codebook of the VQ need not be designed for the worst case scenario (i.e. maximum number of input target vectors). Instead, it could be designed e.g. for a best case scenario, thus comprising more codevectors than could possibly be searched for the maximum number of input target vectors within the maximum complexity constraint $L_{MAX}$. The maximum complexity requirement will be fulfilled by that the extent of the search, i.e. the size of search space, in the CB depends on the number of input target vectors. However, if this would be done "blindly", e.g. without the herein suggested CB, the quality of the quantization would suffer greatly, since there would be no way to know where the "best match" vector is located in the CB, or whether this best match vector is located in a part of the codebook that will be searched when the search space is reduced. This problem is solved by the special design of the codebook, which is described herein. It should be noted that the CB design described herein is beneficial also for applications where the number of input vectors, per coding unit, is constant.

Exemplifying Embodiment 1: Constrained VQ on Spectral Peaks Regions

A set of target vectors s represent spectral peak regions in a transform-domain audio coding, e.g., transform coefficients in the neighborhood of MDCT peaks. Thus, in this context, the number of target vectors varies over time, since the number of spectral peaks varies from one time-block to another.

In this type of application (peak region encoding), the target vectors s exhibit certain symmetries that can be used to further optimize the CB. For example, the transform coefficients on the both sides of a spectral peak have similar statistics. If we assume that the target vectors s are centered at the peak position, the symmetry described above allows adding further structure in the ordered CB from FIGS. 1a and 1b. The structure of such a new, further improved CB is illustrated in FIG. 2. FIG. 2 illustrates a CB where the codevectors of the left part are stored in a memory, such as a Read Only Memory. However, there are no codevectors pre-stored for the right side of the CB, i.e. for the classes $C_{1,flip}$ and $C_{0,flip}$. The codevectors of these classes are flipped versions of the codevectors of the right side of the CB. Thus, when performing a search in the classes $C_{0,flip}$ and $C_{1,flip}$, the search is performed on the codevectors of the left side, which are stored in memory, but with the elements of the codevectors flipped around the center, such that the codevectors $C_{k,flip}$ are given by equation (6)

$$c_{k,flip}=[c_k(M)c_k(M-1)\ldots c_k(1)], \tag{6}$$

where $c_k(m)$ are the vector elements of the corresponding class $C_j$ in the stored CB (i.e. $C_0$ or $C_1$). That is, if the elements of a certain codevector in $C_0$ are $\{C_{01}\ C_{02}\ C_{03}\ C_{04}\}$, the elements of a corresponding codevector in $C_{0,flip}$ are $\{C_{04}\ C_{03}\ C_{02}\ C_{01}\}$ When using a CB as the one illustrated in FIG. 2, an input target vector is compared with four centroids and assigned to a class in order to determine a starting point for the search, i.e. the optimal class for the input target vector is determined by comparing the input vector s to each of the centroids $\{C_0\ C_1\ C_{1,flip}\ C_{0,flip}\}$. This is illustrated in FIG. 3, where a target vector s is input to a class assigning unit 302, which delivers a class indicator, $C_j$, as output. The centroids $C_{1,flip}$ and $C_{0,flip}$ are not stored in a table, but "created" by flipping the elements of the centroids $C_0$ and $C_1$. The elements does not need to be literally flipped, instead a modified search operation may read the elements of C0 and C1 in the reverse order when reading C0, flip and C1, flip, i.e. both centroids and codebook vectors. In this way, the CB may be extended to comprising twice the number of codevectors, as compared to what is physically stored in the CB, which means saving of memory resources. This is possible due to that the symmetry of the peak regions is exploited, as described above. More specifically, the solution is based on the observation that the symmetry may be exploited by that a flipped valid codevector also is a valid codevector.

The search region is adapted to the number of spectral peaks, which corresponds to the number of input target vectors. This is exemplified in FIG. 4, which shows a functional unit 402 taking an indicator of a number of peaks/vectors as input, and producing an indicator of a search region as output. FIG. 4 further illustrates that e.g. the bitrate of a codec applying the VQ could be taken into consideration when determining the search region (search space). For example, there may be different quality requirements for different bitrates, e.g. the higher the bitrate, the higher the expected quality. Further, the allowed maximum complexity may change with the bitrate, e.g. since at different bitrates different modules in a codec are activated, which are not equally complex, i.e. the remaining allowed complexity for the VQ, from a maximum complexity constraint on the whole coding procedure, might not be the same. That is, the bitrate information reflects changes in quality and complexity requirements, which may be taken into consideration in the vector quantization.

The table in FIG. 5 illustrates how the search region is adapted to the number of peaks. In FIG. 5, the search region is indicated as the number of coefficients (codevectors) in the search per input vector. The numbers in the table in FIG. 5 are derived under the assumption that the CB from FIG. 2 comprises four 7-bit segments (four segments with 128 codevectors each) of which two are "normal" or "physical" and two are "flipped" or "virtual").

The logic behind the table in FIG. 5 is that when there is one less peak to code, e.g. 16 instead of 17, the "saved" 128 comparisons may be distributed among the remaining peaks. At some point the search length saturates, because it reaches the physical size of the CB. In the example illustrated in FIG. 5, this point is reached when the number of peaks is 8 or less. That is, in the example illustrated in FIG. 5, when the number of peaks is 8 or less, a full search could be made for all the input target vectors (i.e. peaks) without reaching the maximum allowed complexity.

Examples of the search procedure are illustrated in FIG. 6a-d. In practice, it is the same type of search as the one described earlier in conjunction with FIG. 1a-b, but with additional classification into "normal" and "flipped" CB segments/classes.

Figure 6A:
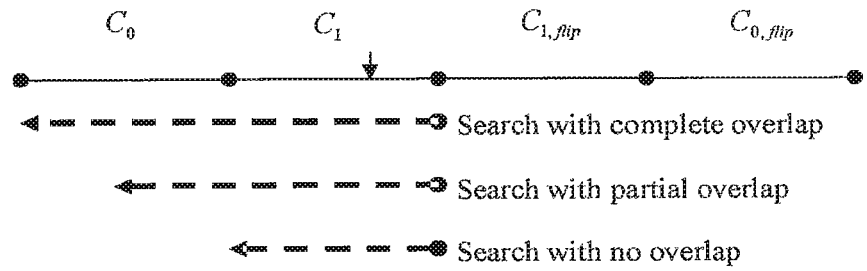
FIGS. 6a-d show examples of different search regions.
Figure 6B:
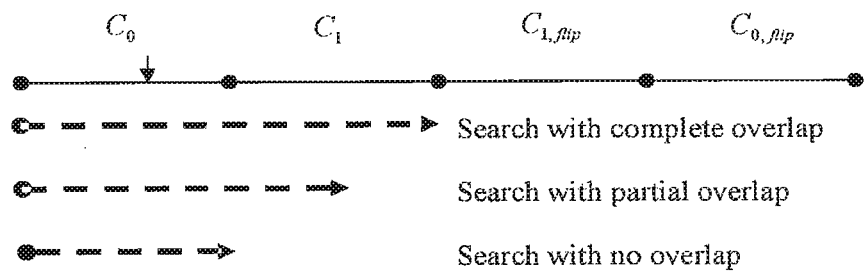

In the example shown in FIG. 6a, the input vector s belongs to class $C_1$ (position indicated with down arrow). The search space is then limited to sizes between the class $C_1$ only, and the joint space of the classes $C_0$ and $C_1$. In FIG. 6a, this is illustrated with three broken arrows indicating search spaces of different sizes. FIG. 6b illustrates the case where an input vector belongs to class $C_0$ (position indicated with down arrow), in which case the search has a different starting point.

Figure 6C:
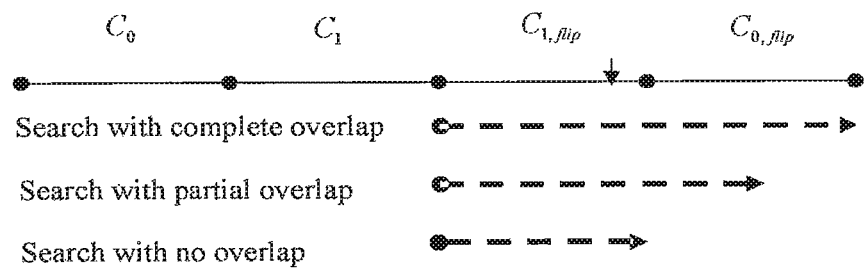
Figure 6D:
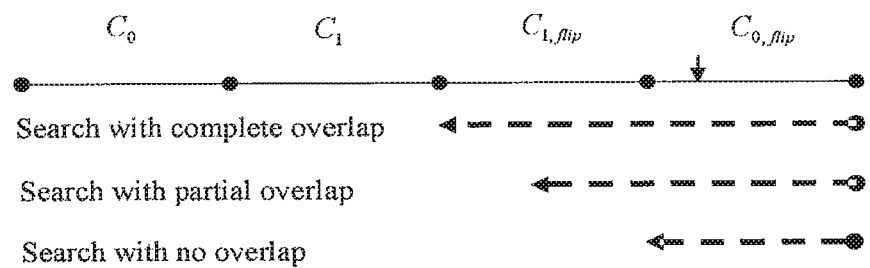

Analogously, as illustrated in FIGS. 6c-d, the search can be performed in classes $C_{1,flip}$ and/or $C_{0,flip}$ if the input vector belongs to one of these classes. No searches are performed in the joint space of $C_1$ and $C_{1,flip}$. The reason for this is that the joint space of a regular and a flipped class does not correspond to a real data set (its statistics do not correspond to real data statistics). Thus, it is not very likely that a good match could be found for an input vector in such a space.

Figure 7:
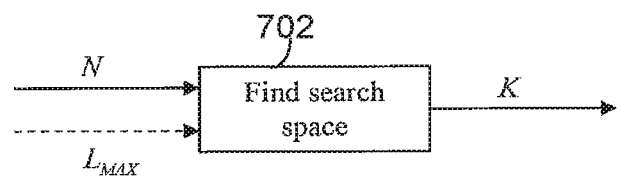
FIG. 7 illustrates that the allowed complexity $L_{MAX}$ may be signaled to the system from an external entity. The parameter $L_{MAX}$ could be based on e.g. CPU load, or battery status.

Exemplifying Embodiment 2: Communication System with External Control of Maximum Allowed Complexity The concept of a VQ having a complexity which is dynamically adjusted to the number of target vectors N can be extended to the case when the complexity limit is not pre-determined, but may vary e.g. based on some criterion, and be signaled to the VQ and/or to the entity in which the VQ is applied. This is illustrated in the schematic block-diagram in FIG. 7, which shows a functional unit 702 taking an indicator or the number of peaks/vectors as input, and further taking a complexity constraint $L_{MAX}$ as input. The functional unit 702 delivers an indicator of a search space/a region of the CB, cf. the broken arrows in FIGS. 6a-d.

The herein presented VQ algorithm with adjustable complexity gives the optimal balance between accuracy of quantization (i.e. quality) and maintaining computational complexity below a pre-defined threshold.

Exemplifying Procedure for Achieving CB Structure

Figure 8:
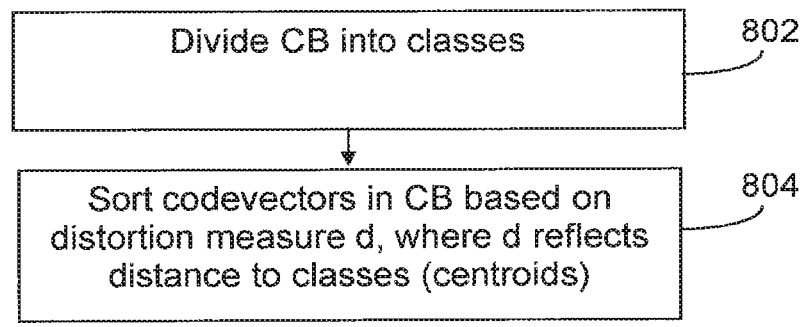
FIG. 8 is a flow chart illustrating the actions in a procedure for creating a codebook, CB, to be used in the suggested technology.

An exemplifying procedure for designing or organizing a CB for use in a VQ will be described below, with reference to FIG. 8. The procedure is for creating a CB for use in a VQ providing quantization in a transform audio encoder, such as e.g. an MDCT encoder.

The procedure described below relates to the parts of a CB creation procedure which deviate from, and/or are additional to, a conventional VQ CB creation or organization.

The CB is divided into classes in an action 802, e.g. by use of a so-called K-means algorithm, as previously described. The codevectors of the CB are then sorted in the CB based on a distortion measure, e.g. as the one described in equation (4). The distortion measure for each codevector depends on a relation between the codevector and centroids representing each class of the CB, as previously described.

This organization of the CB enables adaptation of the search space, and thus of the search complexity in VQ, at a highly preserved VQ quality (e.g. quality of the reconstructed target vectors).

Exemplifying VQ Procedure

Figure 9A:
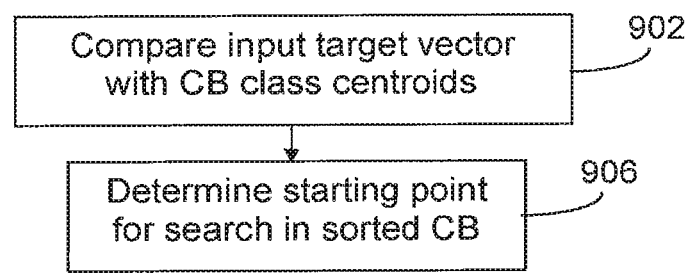
FIG. 9a-c are a flow charts illustrating actions in procedures for vector quantization, VQ, according to examples of the herein suggested technology.

An exemplifying procedure in a vector quantizer (VQ) will be described below, with reference to FIG. 9a. The procedure is suitable for use in a transform audio encoder, such as e.g. an MDCT encoder encoding e.g. spectral peak regions. The audio signal could comprise e.g. speech and/or music.

A number N of input target vectors are received by the VQ, as previously described. Below, the actions associated with one of the input target vectors will be described, for reasons of simplicity.

Figure 9B:
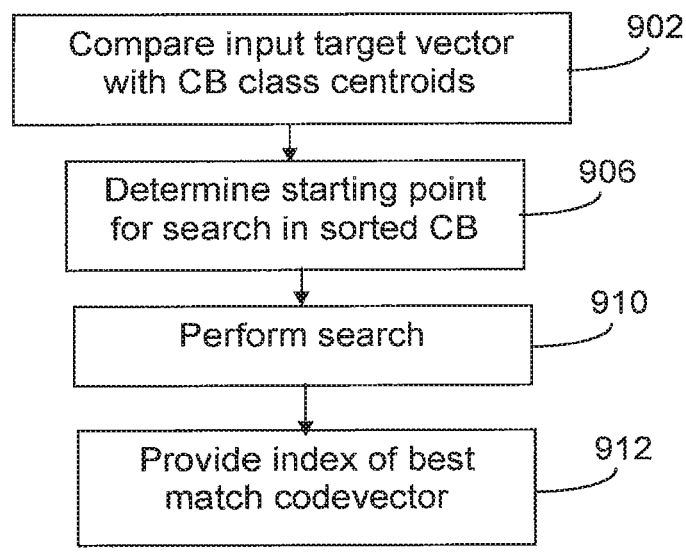

An input target vector s is compared with a number of codevectors each representing a CB class (cf. classes $C_0$ and $C_1$, etc. described earlier), preferably the centroid of each class. The comparison is illustrated as action 902 in FIG. 9a-c. Action 902 could alternatively be regarded as integrated with an action 904, illustrated in FIG. 9c. Depending on the result of the comparisons, the input target vector s is assigned one of the classes, or sections, of the CB, in an action 904. The input target vector s is assigned, or concluded to belong to, the class to which it has the shortest distance, i.e. to which it is most similar, according to some distance measure (error measure). The starting point of the search in the CB is determined in an action 906, based on the class assignment or distance measure.

A search may be performed in the codebook in an action 910. The search is initiated in the selected starting point, and is performed over a search space, which may be of a determined size, comprising one or more classes, or parts thereof. Due to the advantageously designed and organized CB, the probability of that the best match, of all candidate codevectors within the whole CB, for the input target vector s will be found within the search space is very high, even when the search space is limited to e.g. half the CB. In a case where the search space would comprise the entire codebook, the best match codevector would be found early in the search when starting the search at the determined starting point.

When the best match within the determined search space is found, the index of the best match codevector is provided, as a result from the VQ, in an action 912, e.g. for use in an audio decoder.

Figure 9C:
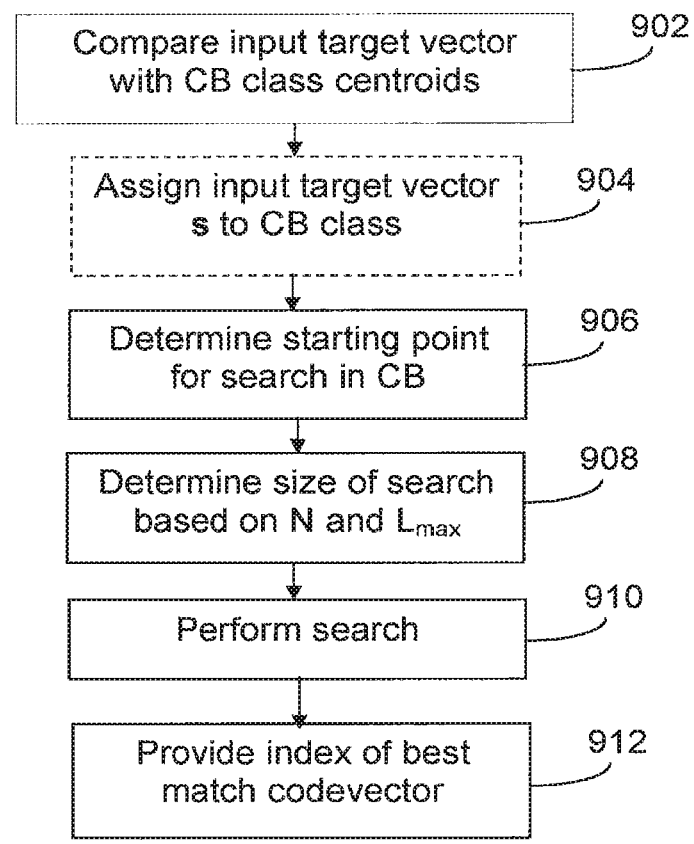

Further, the size of the search space may be determined in an action 908 illustrated in FIG. 9c. The search space may be described as the number of codevectors in the CB that should be evaluated in search for the best match for the input target vector s. The size of the search space is determined based on the number of input target vectors and a constraint on computational complexity $L_{MAX}$. Thus, the size of the search space can be determined e.g. once for every coding block, or some other time interval, depending e.g. on the characteristics of the signal to be quantized and/or the attributes of a codec. If the number of input target vectors and the constraint $L_{MAX}$ are constant or semi-constant over time, the size of the search space may also be kept constant over the corresponding time.

Then, Exemplifying VQ arrangement

Below, an exemplifying VQ arrangement suitable for use in a transform encoder/codec will be described with reference to FIG. 10. The transform codec could be e.g. an MDCT codec. The VQ is adapted to perform the actions of the procedure described above.

The VQ 1001 is illustrated as to communicate with other entities (e.g. audio codec) via a communication unit 1002. The VQ may further comprise other functional units 1016, such as e.g. functional units providing regular functions, and may further comprise one or more storage units 1014.

The VQ 1001 could be implemented e.g. by one or more of: a processor or a micro processor and adequate software with suitable storage therefore, a Programmable Logic Device (PLD) or other electronic component(s) and/or circuits.

The communication unit 1002 is assumed to comprise functional units for obtaining the adequate parameters, such as input target vectors and $L_{MAX}$, provided e.g. from an encoding entity.

The VQ may comprise a comparison unit 1004, which is adapted to compare an input target vector s with vectors representing each class of the CB, e.g. the centroid vector of each class. Further, the VQ may comprise an assigning unit 1006, which is adapted to assign a class to the input target vector s (or assign the vector s to a class), i.e. conclude to which class the vector belongs, based on the comparison. Further, the VQ may comprise a determining unit 1008, adapted to determine an adequate starting point for a search in the CB, based on the class assigned to the vector s. The determining unit may further be adapted to determine the size of a search space in the CB, based e.g. on a number of received input target vectors and a computational complexity constraint.

Further, the VQ may comprise a search unit 1010, which is adapted to perform a search in the CB, starting at the determined starting point and searching the determined search space. The search should result in one or more CB indices pointing to the codevector which best matches the input target vector s. The VQ may further comprise a providing unit 1012, which is adapted to provide said index or indices to another entity, e.g. to (or for use by) a transform codec.

Exemplifying Arrangement

Figure 12:
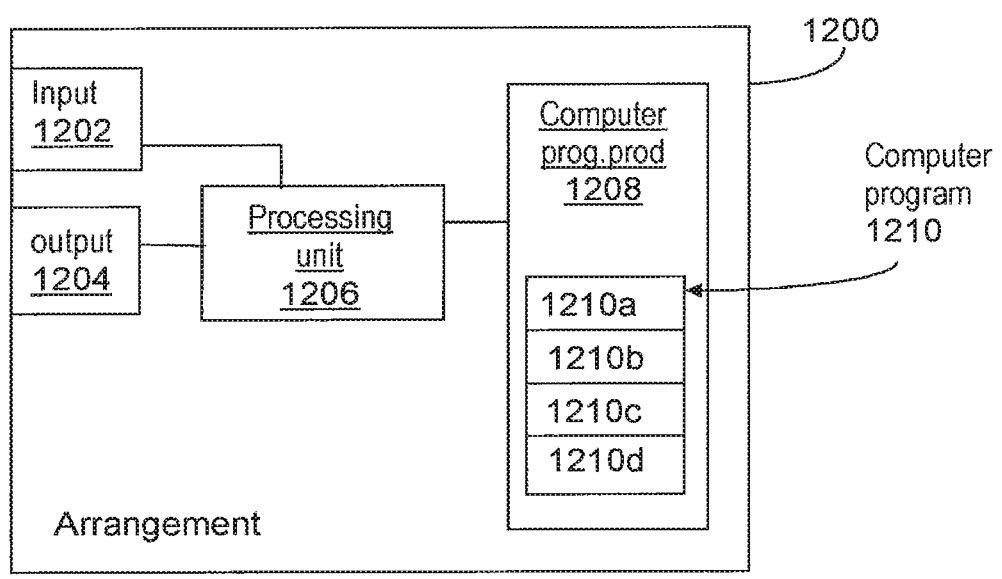
FIG. 12 is a block diagram illustrating an arrangement for vector quantization, according to an example of the herein suggested technology.

FIG. 12 schematically shows an embodiment of an arrangement 1200 suitable for use in e.g. a transform audio decoder, which also can be an alternative way of disclosing an embodiment of the VQ illustrated in FIG. 5. Comprised in the arrangement 1200 are here a processing unit 1206, e.g. with a DSP (Digital Signal Processor). The processing unit 1206 can be a single unit or a plurality of units to perform different steps of procedures described herein. The arrangement 1200 may also comprise the input unit 1202 for receiving signals, such as input target vectors and indicators of e.g. bitrate and/or complexity constraint; and further the output unit 1204 for output signal(s), such as the CB indices for the best match codevectors. The input unit 1202 and the output unit 1204 may be arranged as one in the hardware of the arrangement.

Furthermore the arrangement 1200 comprises at least one computer program product 1208 in the form of a non-volatile memory, e.g. an EEPROM, a flash memory and a hard drive. The computer program product 1208 comprises a computer program 1210, which comprises code means, which when run in the processing unit 1206 in the arrangement 1200 causes the arrangement to perform the actions of a procedure described earlier in conjunction with FIGS. 9a-c.

Hence, in the exemplifying embodiments described, the code means in the computer program 1210 of the arrangement 1200 may comprise a comparison module 1210a for comparing an input target vector with class centroids of a CB. The computer program may comprise an assigning module 1210*b* for assigning a class to the input target vector. The computer program 1210 may further comprise a determining unit 1210*c* for determining a starting point for a search in the CB; and further for determining a search space or region based on input parameters. The computer program 1210 may further comprise a search unit 1210*d* for searching the CB according to the above. Further, the computer program 1210 may comprise a providing module 1210*e*, for providing indices, which are output from the search to other entities.

The computer program 1210 is in the form of computer program code structured in computer program modules. The modules 1210*a-e* may essentially perform the actions of the flow illustrated in any of FIGS. 9*a-c* to emulate at least part of the VQ 1001 illustrated in FIG. 10. In other words, when the different modules 1210*a-d* are run on the processing unit 1206, they correspond at least to the units 1004-1012 of FIG. 10.

Although the code means in the embodiment disclosed above in conjunction with FIG. 12 are implemented as computer program modules which when run on the processing unit causes the arrangement and/or transform audio encoder to perform steps described above in the conjunction with figures mentioned above, at least one of the code means may in alternative embodiments be implemented at least partly as hardware circuits.

While the suggested technology has been described with reference to specific example embodiments, the description is in general only intended to illustrate the concept and should not be taken as limiting the scope of the technology described herein. The different features of the exemplifying embodiments above may be combined in different ways according to need, requirements or preference.

The solution described above may be used wherever VQs are applied, e.g. in codecs in devices such as mobile terminals, tablets, computers, smart phones, etc.

It is to be understood that the choice of interacting units or modules, as well as the naming of the units are only for exemplifying purpose, and nodes suitable to execute any of the methods described above may be configured in a plurality of alternative ways in order to be able to execute the suggested process actions.

The functions of the various elements including functional blocks, including but not limited to those labeled or described as "functional unit", "processor" or "controller", may be provided through the use of hardware such as circuit hardware and/or hardware capable of executing software in the form of coded instructions stored on computer readable medium. Thus, such functions and illustrated functional blocks are to be understood as being either hardware-implemented and/or computer-implemented, and thus machine-implemented.

In terms of hardware implementation, the functional blocks may include or encompass, without limitation, digital signal processor (DSP) hardware, reduced instruction set processor, hardware (e.g., digital or analog) circuitry including but not limited to application specific integrated circuit (s) (ASIC), and (where appropriate) state machines capable of performing such functions.

ABBREVIATIONS

SQ Scalar Quantization
VQ Vector Quantization
CB Codebook
WMOPS Weighted Millions of Operations Per Second
MDCT Modified Discrete Cosine Transform

The invention claimed is:

1. A method performed by a transform codec comprising a Vector Quantizer, the method comprising:
    operating a processor of the transform codec that executes computer readable instructions from a memory to perform:
        comparing an input target vector s with four centroids $C_0$, $C_1$, $C_{0,flip}$ and $C_{1,flip}$, wherein centroid $C_{0,flip}$ is a flipped version of centroid $C_0$ and centroid $C_{1,flip}$ is a flipped version of centroid $C_1$, each centroid representing a respective class of codevectors in a codebook, wherein the input target vector s comprises transform coefficients derived from an audio signal or a video signal;
        determining a starting point for a search related to the input target vector in the codebook, based on the result of the comparison; and
        performing a search in the codebook, starting at the determined starting point, and identifying a codevector to represent the input target vector s, wherein a number of input target vectors per time segment is variable and a search space is dynamically adjusted to the number of input target vectors;
        wherein the codebook has been created such that the codevectors in the codebook are sorted according to a distortion measure reflecting the distance between each codevector and said centroids $C_0$ and $C_1$.

2. The method according to claim 1, wherein the search space is dynamically adjusted by increasing or reducing the size of the search space based on the number of target vectors.

3. The method according to claim 1, wherein the codevectors in the codebook are sorted such that the codewords closest to a first centroid $C_0$ and most distanced to a second centroid $C_1$ are in one class $C_0$ of the codebook, while codewords closest to $C_1$ and most distanced to $C_0$ are clustered in the other class $C_1$ of the codebook.

4. The method according to claim 1, wherein codevectors for a class $C_{0,flip}$ are flipped versions of codevectors for a class $C_0$ and codevectors for a class $C1_{flip}$ are flipped versions of codevectors for a class $C_1$.

5. The method according to claim 4, wherein elements of codevectors $c_{k,flip}$ in class $C_{j,flip}$ are given by equation:

$$c_{k,flip}=[c_k(M)c_k(M-1)\ldots c_k(1)],$$

where $c_k(m)$ are vector elements of the corresponding class $C_j$ and M is a length of the codevector and k is and index of the codevector.

6. A Transform codec comprising a Vector Quantizer comprising:
    at least one processor and at least one memory coupled to the at least one processor, wherein the at least one memory stores computer program instructions that are executed by the at least one processor to perform operations comprising:
        obtaining a variable number of input target vectors s per time segment, wherein each of the input target vectors s comprises transform coefficients derived from an audio signal or a video signal;
        comparing an input target vector s with four centroids $C_0$, $C_1$, $C_{0,flip}$ and $C_{1,flip}$, wherein centroid $C_{0,flip}$ is a flipped version of centroid $C_0$ and centroid $C_{1,flip}$ is a flipped version of centroid $C_1$, each centroid representing a respective class of codevectors in a codebook;

determine a starting point for a search in the codebook, based on the result of the comparison, and to dynamically adjust a search space to the number of input target vectors; and perform a search in the codebook, starting at the determined starting point, and identifying a codevector to represent the input target vector s;

wherein the codevectors in the codebook are sorted according to a distortion measure reflecting the distance between each codevector and said centroids $C_0$ and $C_1$.

7. The Transform codec according to claim 6, wherein dynamically adjusting the search space comprises increasing or reducing the size of the search space based on the number of target vectors.

8. The Transform codec according to claim 6, wherein the codevectors in the codebook are sorted such that the codewords closest to a first centroid $C_0$ and most distanced to a second centroid $C_1$ are in one class $C_0$ of the codebook, while codewords closest to $C_1$ and most distanced to $C_0$ are clustered in the other class $C_1$ of the codebook.

9. The Transform codec according to claim 6, further comprising comparing the input target vector with four centroids $C_0$, $C_1$, $C_{0,flip}$ and $C_{1,flip}$, where codevectors for a class $C_{0,flip}$ are flipped versions of codevectors for a class $C_0$ and codevectors for a class $C1_{flip}$ are flipped versions of codevectors for a class $C_1$.

10. The Transform codec according to claim 9, wherein elements of codevectors $c_{k,flip}$ in class $C_{j,flip}$ are given by equation:

$$c_{k,flip}=[c_k(M)c_k(M-1) \ldots c_k(1)],$$

where $c_k(m)$ are vector elements of the corresponding class $C_j$ and M is a length of the codevector and k is and index of the codevector.

11. A Mobile terminal comprising the transform codec according to claim 6.

12. A Computer program product comprising:

a non-transitory computer readable medium storing computer program instructions that are executed by at least one processor to perform operations comprising:

obtaining a variable number of input target vectors s per time segment, wherein each of the input target vectors s comprises transform coefficients derived from an audio signal or a video signal;

comparing an input target vector s with four centroids $C_0$, $C_1$, $C_{0,flip}$ and $C_{1,flip}$, wherein centroid $C_{0,flip}$ is a flipped version of centroid $C_0$ and centroid $C_{1,flip}$ is a flipped version of centroid $C_1$, each centroid representing a respective class of codevectors in a codebook;

determine a starting point for a search in the codebook, based on the result of the comparison, and to dynamically adjust a search space to the number of input target vectors; and perform a search in the codebook, starting at the determined starting point, and identifying a codevector to represent the input target vector s;

wherein the codevectors in the codebook are sorted according to a distortion measure reflecting the distance between each codevector and said centroids $C_0$ and $C_1$.

13. The computer program product according to claim 12, wherein the search space is dynamically adjusted by increasing or reducing the size of the search space based on the number of target vectors.

14. The computer program product according to claim 12, wherein the codevectors in the codebook are sorted such that the codewords closest to a first centroid $C_0$ and most distanced to a second centroid $C_1$ are in one class $C_0$ of the codebook, while codewords closest to $C_1$ and most distanced to $C_0$ are clustered in the other class $C_1$ of the codebook.

15. The computer program product according to claim 12, wherein codevectors for a class $C_{0,flip}$ are flipped versions of codevectors for a class $C_0$ and codevectors for a class $C1_{flip}$ are flipped versions of codevectors for a class $C_1$.

16. The computer program product according to claim 15, wherein elements of codevectors $c_{k,flip}$ in class $C_{j,flip}$ are given by equation:

$$c_{k,flip}=[c_k(M)c_k(M-1) \ldots c_k(1)],$$

where $c_k(m)$ are vector elements of the corresponding class $C_j$ and M is a length of the codevector and k is and index of the codevector.

* * * * *

UNITED STATES PATENT AND TRADEMARK OFFICE
CERTIFICATE OF CORRECTION

PATENT NO. : 10,468,044 B2
APPLICATION NO. : 15/805768
DATED : November 5, 2019
INVENTOR(S) : Grancharov et al.

It is certified that error appears in the above-identified patent and that said Letters Patent is hereby corrected as shown below:

In the Drawings

Figure 10:
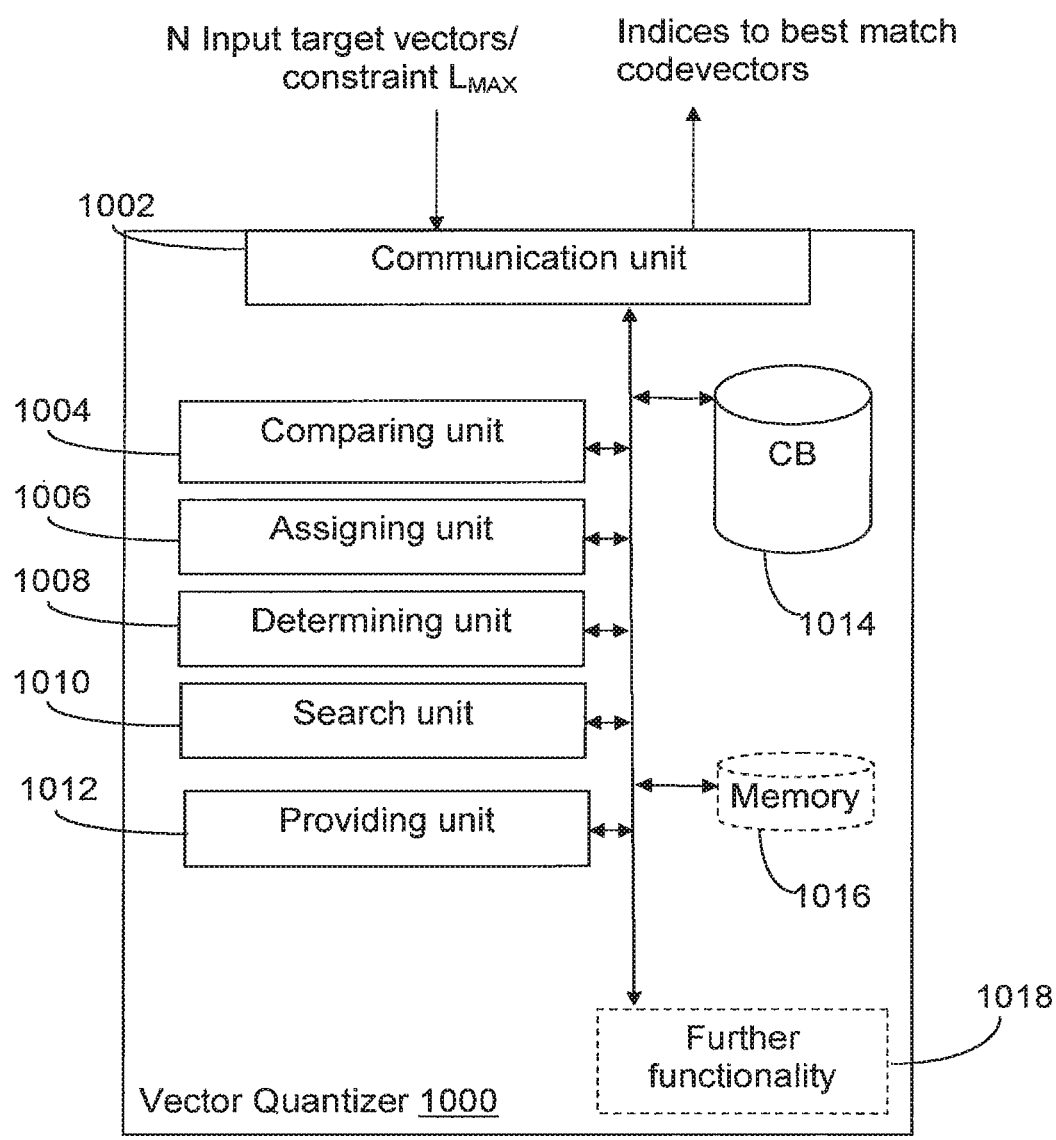
FIG. 10 is a block diagram illustrating a vector quantizer, according to an example of the herein suggested technology.
Figure 11:
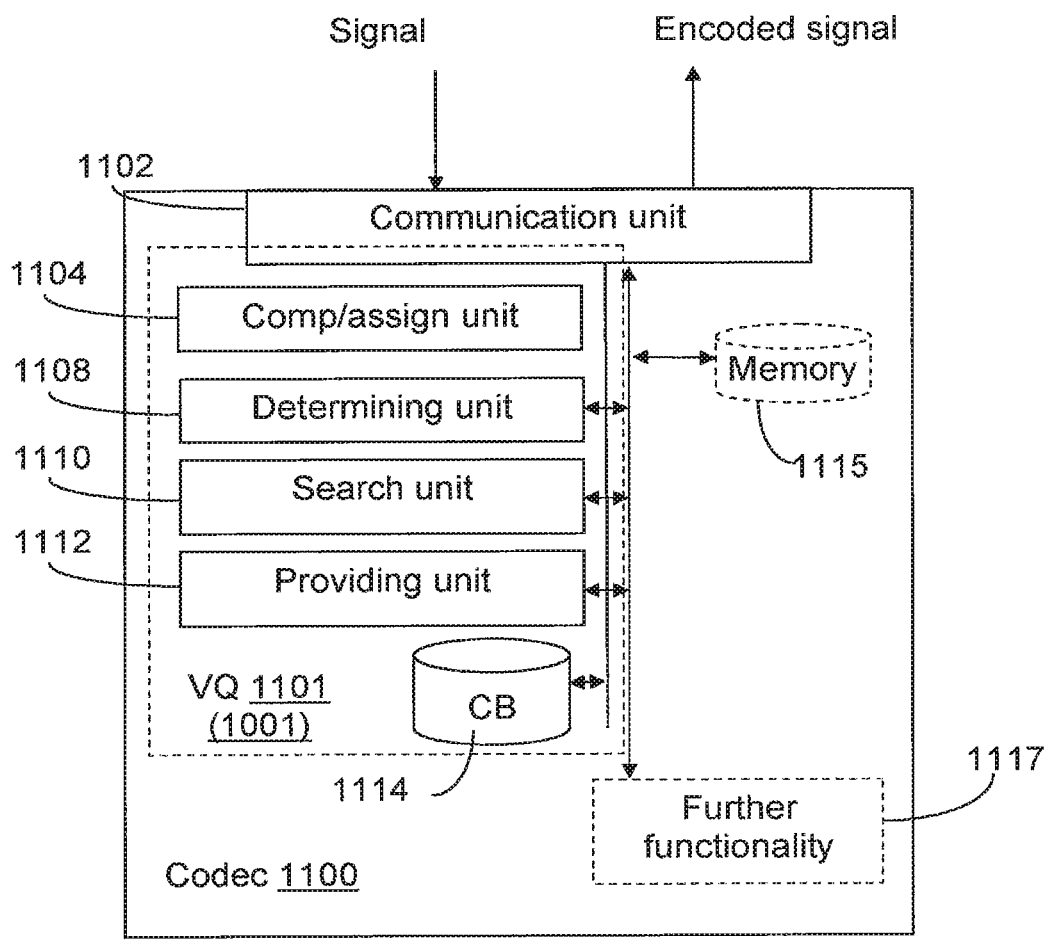
FIG. 11 is a block diagram illustrating a codec comprising a vector quantizer, according to an example of the herein suggested technology.

In Fig. 10, Sheet 7 of 9, delete Tag "1000" and insert Tag -- 1001 --, therefor.

In the Claims

In Column 12, Line 42, in Claim 4, delete "C1,flip" and insert -- $C_{1,flip}$ --, therefor.

In Column 13, Line 25, in Claim 9, delete "C1,flip" and insert -- $C_{1,flip}$ --, therefor.

In Column 14, Line 32, in Claim 15, delete "C1,flip" and insert -- $C_{1,flip}$ --, therefor.

Signed and Sealed this
Thirty-first Day of March, 2020

Andrei Iancu
*Director of the United States Patent and Trademark Office*